(12) United States Patent
Ku et al.

(10) Patent No.: US 6,184,130 B1
(45) Date of Patent: *Feb. 6, 2001

(54) SILICIDE GLUE LAYER FOR W-CVD PLUG APPLICATION

(75) Inventors: Tzu-Kun Ku; Hsueh-Chung Chen, both of Taipei; Chine-Gie Lou, Hsinchu, all of (TW)

(73) Assignee: Industrial Technology Research Institute, Hsin-Chu (TW)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/965,313

(22) Filed: Nov. 6, 1997

(51) Int. Cl.$^7$ .................................. H01L 21/44
(52) U.S. Cl. .................. 438/655; 438/628; 438/629; 438/630; 438/644; 438/648; 438/649; 438/654; 438/655; 438/656; 438/669; 438/672; 438/674; 438/675; 438/677; 438/685
(58) Field of Search ..................... 438/628, 629, 438/630, 644, 648, 649, 654, 655, 656, 669, 672, 674, 675, 677, 685

(56) References Cited

U.S. PATENT DOCUMENTS

| | | | |
|---|---|---|---|
| 5,023,201 | * | 6/1991 | Stanasolovich et al. ............ 437/192 |
| 5,030,588 | * | 7/1991 | Hosaka .................................. 437/60 |
| 5,183,782 | * | 2/1993 | Onishi et al. ....................... 437/192 |
| 5,286,675 | | 2/1994 | Chen et al. .......................... 437/195 |
| 5,397,742 | | 3/1995 | Kim ..................................... 437/190 |
| 5,604,158 | * | 2/1997 | Cadien et al. ....................... 437/200 |

* cited by examiner

Primary Examiner—John F. Niebling
Assistant Examiner—David A Zarneke
(74) Attorney, Agent, or Firm—George O. Saile; Stephen B. Ackerman; Rosemary L.S. Pike

(57) ABSTRACT

A new method of tungsten plug metallization using a silicide glue layer is described. Semiconductor device structures are provided in and on a semiconductor substrate. An insulating layer is provided covering the semiconductor device structures wherein a contact opening is made through the insulating layer to one of the semiconductor device structures. A silicide layer is deposited conformally over the surface of the insulating layer and within the contact opening as a combined ohmic contact and glue layer. In a first embodiment, a tungsten layer is deposited overlying the silicide layer. The tungsten layer not within the contact opening is removed to complete the formation of the tungsten plug metallization. In a second embodiment, the silicide layer not within the contact opening is selectively removed and a tungsten layer is selectively deposited overlying the silicide layer within the contact opening to complete formation of the tungsten plug metallization in the fabrication of an integrated circuit.

23 Claims, 5 Drawing Sheets

SILICIDE GLUE LAYER FOR W-CVD PLUG APPLICATION

BACKGROUND OF THE INVENTION

(1) Field of the Invention

The invention relates to a method of metallization in the fabrication of integrated circuits, and more particularly, to a method of tungsten plug metallization in the manufacture of integrated circuits.

(2) Description of the Prior Art

Tungsten-plug metallization is widely used in the art for vertical interconnects of various metal layers in integrated circuit fabrication. A conventional tungsten chemical vapor deposition (W-CVD) process is illustrated in FIG. 1. A contact hole is opened in a dielectric layer 14 overlying a semiconductor substrate 10. A glue layer 18 is deposited over the dielectric layer and within the contact opening. Typically, the glue layer, which is used as a nucleation layer for the CVD tungsten, comprises titanium nitride, 500 to 1500 Angstroms in thickness, with a thin titanium underlayer, 100 to 500 Angstroms, for adhesion. A tungsten layer 22 is then deposited by CVD and etched back, as shown in FIG. 2, to form the tungsten plug. However, this process if associated with high complexity and cost, high via resistance, and poor controllability of particulation. Moreover, the continuous scaling down of the contact hole size causes great difficulty in filling the contact hole.

U.S. Pat. No. 5,286,675 to Chen et al teaches a procedure for forming tungsten plugs including the conventional Ti/TiN as the glue layer and the use of reactive ion etching (RIE) to remove the tungsten layer to form the plug. U.S. Pat. No. 5,397,742 to Kim shows the use of a $TiSi_2$ glue layer overlying a Ti/TiN layer which is etched away after the tungsten plug is formed in order to remove tungsten residue.

SUMMARY OF THE INVENTION

A principal object of the present invention is to provide an effective and very manufacturable method of tungsten plug metallization.

Another object of the invention is to provide a method of tungsten plug metallization with reduced cost and complexity.

Yet another object is to provide a method of tungsten plug metallization with reduced glue layer thickness.

A still further object of the invention is to provide a method of tungsten plug metallization having improved contact resistance.

Yet another object is to provide a method of tungsten plug metallization using a silicide as a combined ohmic contact and glue layer.

Yet another object of the invention is to provide a method of tungsten plug metallization with reduced cost and complexity using a silicide as a combined ohmic contact and glue layer.

In accordance with the objects of this invention a new method of tungsten plug metallization using a silicide glue layer is achieved. Semiconductor device structures are provided in and on a semiconductor substrate. An insulating layer is provided covering the semiconductor device structures wherein a contact opening is made through the insulating layer to one of the semiconductor device structures. A silicide layer is deposited conformally over the surface of the insulating layer and within the contact opening as a combined ohmic contact and glue layer. In a first embodiment, a tungsten layer is deposited overlying the silicide layer. The tungsten layer not within the contact opening is removed to complete the formation of the tungsten plug metallization. In a second embodiment, the silicide layer not within the contact opening is selectively removed and a tungsten layer is selectively deposited overlying the silicide layer within the contact opening to complete formation of the tungsten plug metallization in the fabrication of an integrated circuit.

Also in accordance with the objects of this invention, an integrated circuit device having tungsten plug metallization using a silicide glue layer is described. Semiconductor device structures are formed in and on a semiconductor substrate. An insulating layer covers the semiconductor device structures. A patterned metal layer overlies the insulating layer. A tungsten plug extends through the insulating layer connecting the patterned metal layer with one of the semiconductor device structures. A silicide layer lies between the tungsten plug and the insulating layer and between the tungsten plug and the one of the semiconductor device structures wherein the silicide layer acts as an ohmic contact and glue layer.

BRIEF DESCRIPTION OF THE DRAWINGS

In the accompanying drawings forming a material part of this description, there is shown.

DESCRIPTION OF THE PREFERRED EMBODIMENTS

The process of the present invention applies silicide as the nucleation or glue layer. Silicides have low contact resistance and provide a thinner barrier layer than titanium/titanium nitride. This is especially beneficial as contact hole sizes shrink. Silicide is already used in the fabrication of a contact structure. Usually, it is fabricated by rapid thermal processing after sputtering a thin titanium layer on the silicon substrate. In the process of the present invention, the inventors extend the application of this silicide layer by depositing a blanket layer of silicide. The silicide glue layer can be deposited using common manufacturing processes, thereby reducing the cost and complexity of tungsten plug metallization.

FIGS. 3 through 6 illustrate a first preferred embodiment of the present invention, a blanket CVD W plug process using a blanket silicide glue layer. A silicide film is blanket deposited as the nucleation or glue layer. Then a blanket W CVD process is used to form the tungsten plug.

Figure 1:
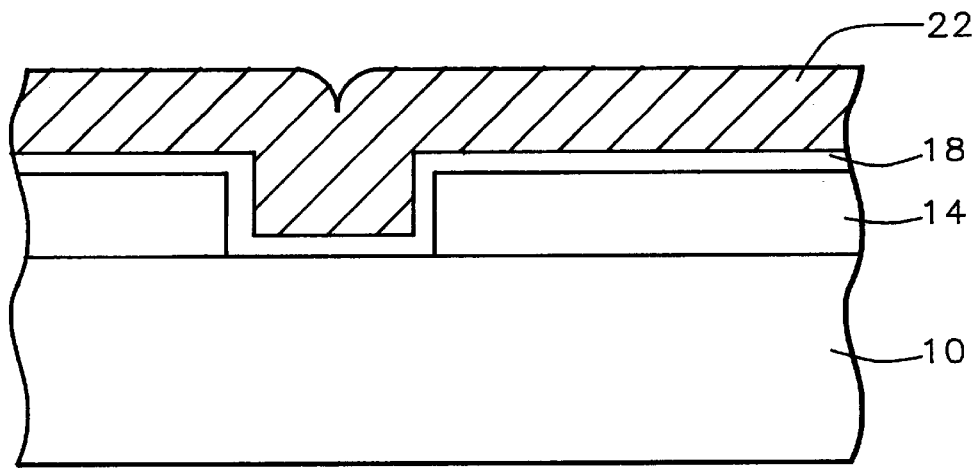
FIGS. 1 and 2 schematically illustrate in cross-sectional representation a conventional tungsten plug process of the prior art.
Figure 2:
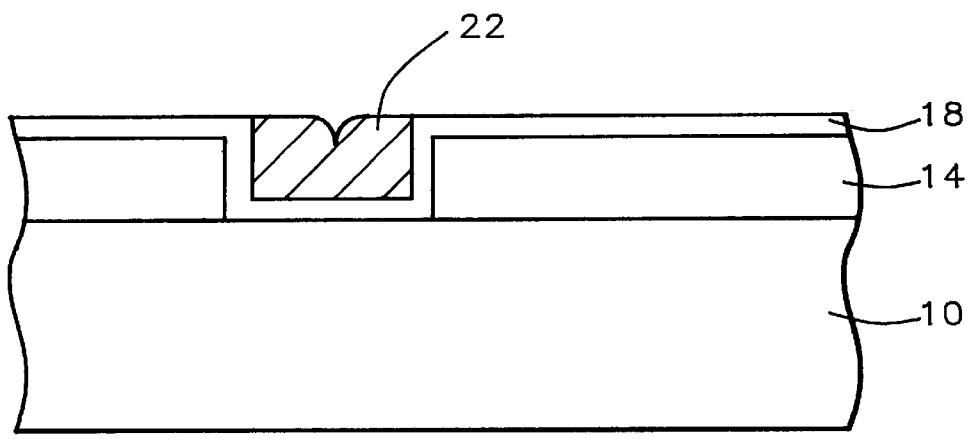
Figure 3:
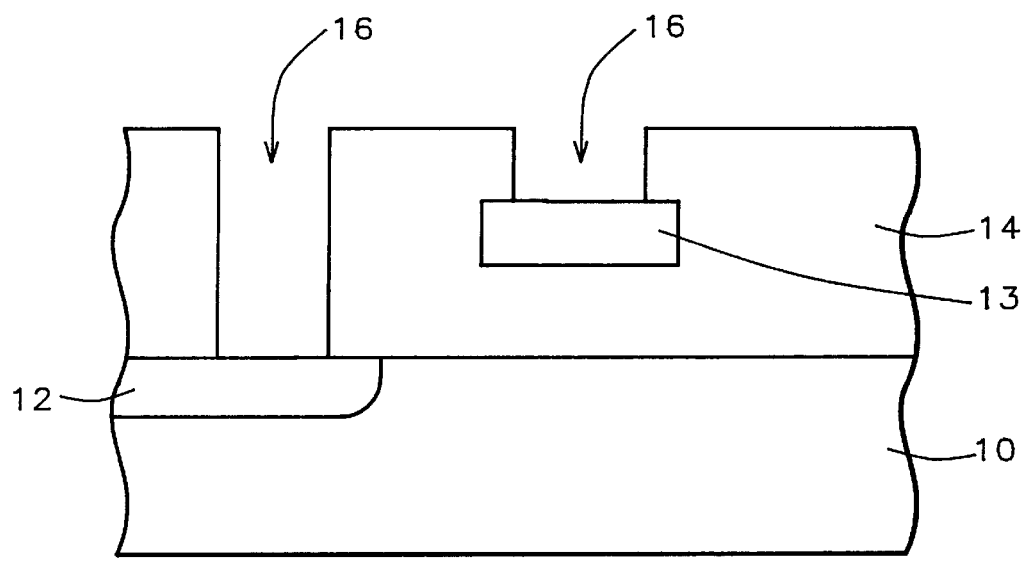
FIGS. 3 through 6 schematically illustrate in cross-sectional representation a first preferred embodiment of the present invention.

Referring now more particularly to FIG. 3, there is illustrated a portion of a partially completed integrated circuit. There is shown a semiconductor substrate 10, preferably composed of monocrystalline silicon. A junction 12 has been formed within the semiconductor substrate. This may be a buried contact junction or a source/drain region, or the like. Polysilicon gate electrodes (not shown) and interconnection lines 13 are formed as is conventional in the art.

An interlevel dielectric layer 14, composed of silicon dioxide, borophosphosilicate glass (BPSG), borosilicate glass (BSG), or phosphosilicate glass (PSG), or the like, is deposited over the surface of the semiconductor device structures to a thickness of between about 200 to 500 Angstroms. Typically, the interlevel dielectric layer 14 comprises a first layer of undoped silicate glass (USG), a second layer of BPSG, and a third layer of USG. Contact holes 16 are opened through the insulating layer to the junction 12 within the semiconductor substrate and to the interconnection line 13 where contact is to be made. It will be understood by those skilled in the art that the process of the present invention can be used for higher level metallization as well and that the polysilicon interconnection line 13 could be a first level metal line where the tungsten plug to be formed will connect the metal line to a second level metal line.

Figure 4:
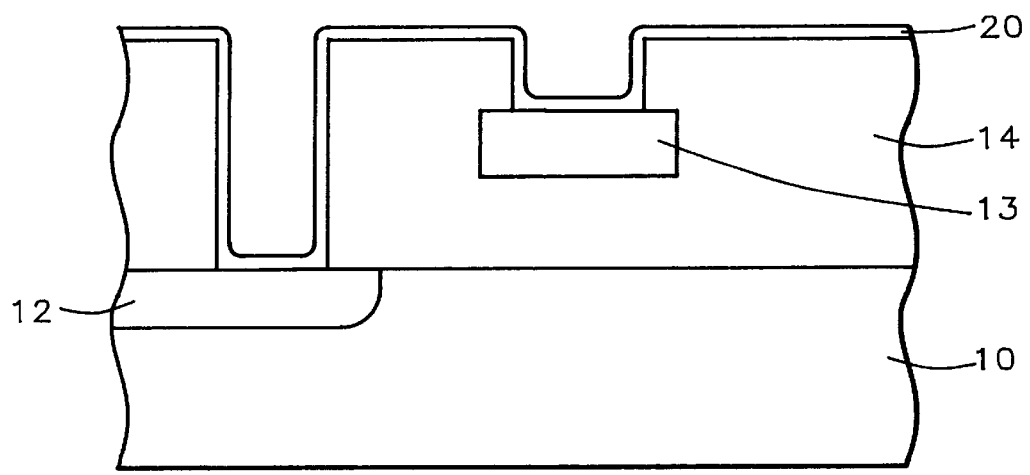

Referring now to FIG. 4, a silicide layer 20 is blanket deposited conformally over the surface of the insulating layer 14 and within the contact holes 16. For a low resistance glue layer, many silicide materials can be used, such as $WSi_x$, $TiSi_2$, $CoSi_2$, $NiSi_x$, $PtSi_2$, $PdSi_2$, and the like. The layer 20 may be deposited by chemical vapor deposition (CVD) or physical vapor deposition (PVD) to a thickness of between about 200 to 500 Angstroms.

Figure 5:
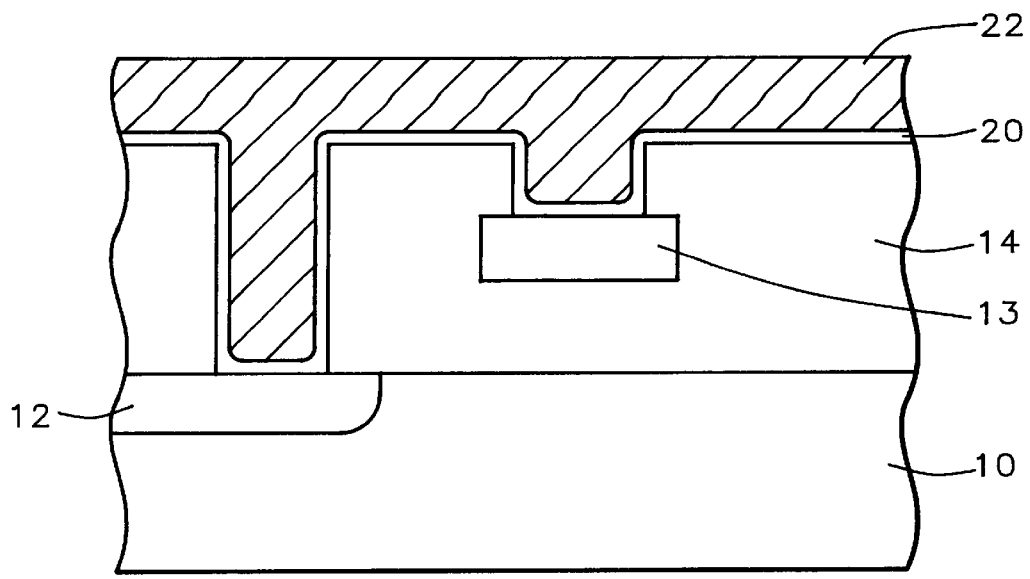

Referring now to FIG. 5, tungsten 22 is blanket deposited over the surface of the substrate using $WF_6$ with $SiH_4$, $SiH_2Cl_2$, or $H_2$ as precursors in a chemical vapor deposition chamber.

Figure 6:
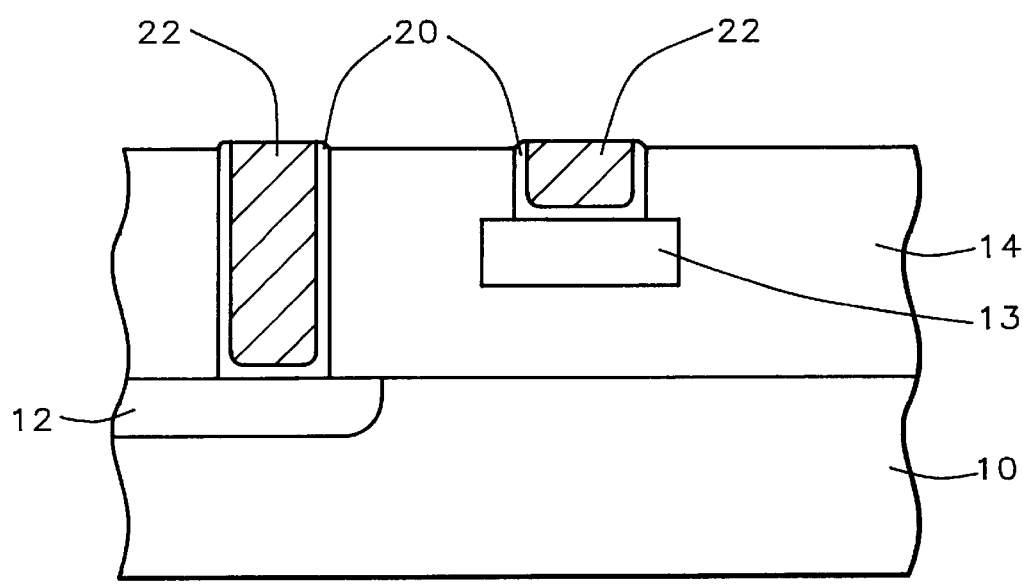

Referring now to FIG. 6, the tungsten is etched back using RIE or chemical mechanical polishing (CMP) to form tungsten plugs 22 within the contact holes. The silicide 20 not within the contact holes is also removed after tungsten etchback.

The contact silicidation process reduces contact resistance as well as the liner resistance compared with the conventional titanium nitride nucleation layer. Since a thinner glue layer is used, the problem of the glue layer's filling a small contact opening is avoided. An in-situ or clustered CVD W/silicide bi-layer may be formed in a single chamber or cluster tool. Because the silicide layer acts as both the adhesion layer and the nucleation layer, fewer steps are required in the process of the present invention than in the conventional process resulting in lower costs.

Figure 7:
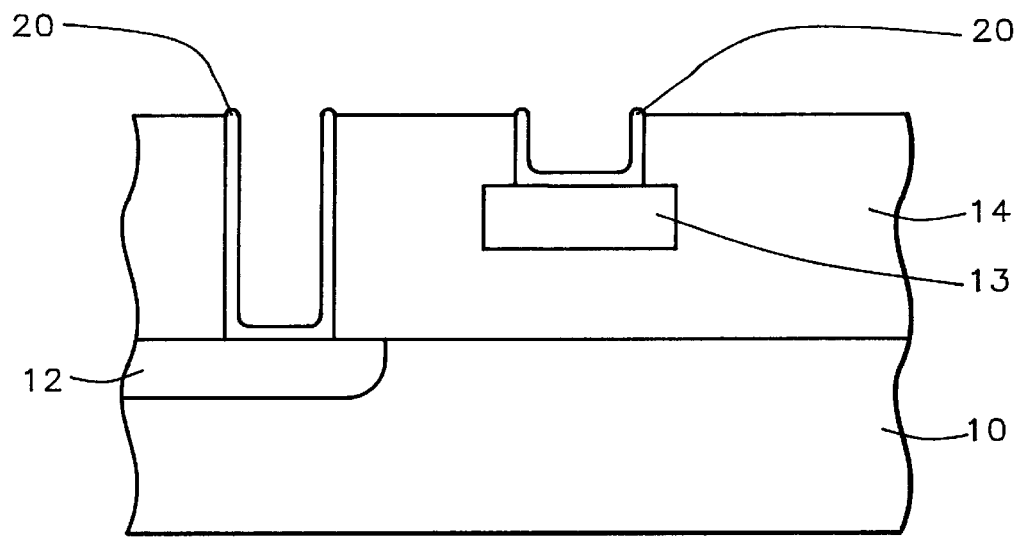
FIGS. 7 and 8 schematically illustrate in cross-sectional representation a second preferred embodiment of the present invention.
Figure 8:
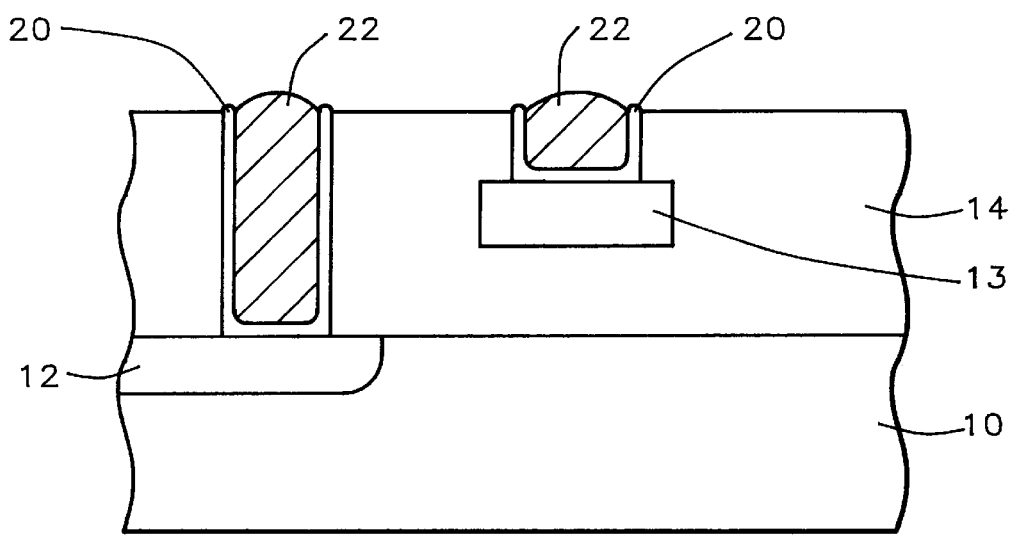

FIGS. 7 and 8 illustrate a second preferred embodiment of the present invention. In this embodiment, a silicide is deposited as a nucleation or glue layer and then selectively removed from the surface of the insulating layer. A selective CVD W process forms the tungsten plug 22.

As above, the process of the present invention in the second preferred embodiment begins with the opening of the contact holes through the insulating layer as shown in FIG. 3. As in the first embodiment, the silicide layer 20 is deposited over the insulating layer and within the contact openings as shown in FIG. 4.

Referring now to FIG. 7, which follows FIG. 4 in this embodiment, selective chemical mechanical polishing (CMP) is used to remove the silicide layer 20 from the top surface of the insulating layer, leaving the silicide only on the sidewalls and on the bottoms of the contact openings.

Referring now to FIG. 8, selective W CVD is performed with precursors of $WF_6$ with $SiH_4$, $SiH_2Cl_2$, or $H_2$. For example, $WF_6$ is flowed at 100 sccm and $H_2$ is flowed at 1000 to 2000 sccm at a temperature of 430° C. and pressure of 200 mTorr. This process forms tungsten plugs 22.

The selective CVD W plug process using a selective silicide glue layer solves the problem of filling contact openings of different depths because the tungsten grows from the sidewalls as well as from the bottom of the contact openings. In the traditional selective CVD W process, the W growth is from the bottom of the contact opening only. The tungsten growth from the sidewall provides better adhesion of the tungsten plug to the contact and reduces selectivity loss since deposition time is reduced.

The contact silicidation process reduces contact resistance as well as the liner resistance compared with the conventional titanium nitride nucleation layer. Because the silicide layer acts as both the adhesion layer and the nucleation layer, fewer steps are required in the process of the present invention than in the conventional process resulting in lower costs. The silicide barrier also allows for lower junction leakage.

Figure 9:
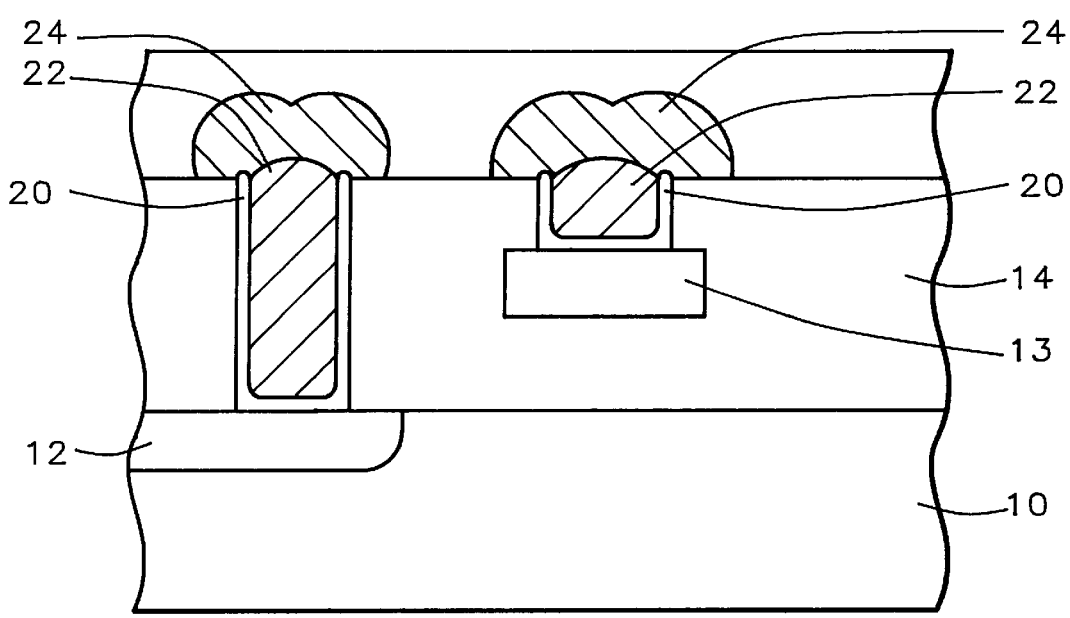
FIG. 9 schematically illustrates in cross-sectional representation a completed integrated circuit device of the present invention.

FIG. 9 illustrates further processing after the tungsten plugs have been completed. FIG. 9 follows FIG. 8, but processing would be similar following FIG. 6. A second metallization 24, such as an aluminum alloy, is deposited and patterned. A passivation layer 26 completes fabrication of the integrated circuit. Of course, other processes may be performed such as an intermetal dielectric deposition and further metallization, as is well known in the art. Higher level tungsten plug metallization may be performed using either of the two alternative embodiments of the present invention.

Referring now to FIG. 9, the integrated circuit device of the present invention having tungsten plug metallization using a silicide glue layer will be described. Semiconductor device structures are formed in and on a semiconductor substrate. These may include a buried contact junction or a source/drain region, or the like, 12, polysilicon gate electrodes (not shown) and interconnection lines 13. Alternatively, line 13 may be a first level of metallization. An insulating layer 14 covers the semiconductor device structures. A patterned metal layer overlies the insulating layer 24. A tungsten plug 22 extends through the insulating layer 14 connecting the patterned metal layer 24 with the semiconductor device structures 12 and 13. A silicide layer 20 lies between the tungsten plug 22 and the insulating layer 14 and between the tungsten plug 22 and the semiconductor device structures 12 and 13 wherein the silicide layer acts as an ohmic contact and glue layer.

The process of the present invention uses CVD deposited refractory metal silicide, which is widely used as an ohmic contact layer, as the glue layer for the tungsten plug. This process not only eliminates the complexity of the conventional process, but also reduces the thickness of the glue layer as compared to the conventional Ti/TiN glue layer.

While the invention has been particularly shown and described with reference to the preferred embodiments thereof, it will be understood by those skilled in the art that various changes in form and details may be made without departing from the spirit and scope of the invention.

What is claimed is:

1. A method of forming tungsten plug metallization in the fabrication of integrated circuits comprising:

providing semiconductor device structures in and on a semiconductor substrate;

providing an insulating layer covering said semiconductor device structures wherein a contact opening is made through said insulating layer to one of said semiconductor device structures;

depositing a silicide layer conformally over the surface of said insulating layer and within said contact opening wherein said silicide layer acts as an ohmic contact and glue layer and wherein said silicide layer comprises one of the group containing $TiSi_2$, $CoSi_2$, $NiSi_x$, $PtSi_2$, and $PdSi_2$ and is deposited to a thickness of between 200 and 500 Angstroms;

depositing a tungsten layer overlying said silicide layer; and removing said tungsten layer and said silicide layer not within said contact opening to complete said formation of said tungsten plug metallization in said fabrication of said integrated circuit.

2. The method according to claim 1 wherein said semiconductor device structures include source and drain regions and polysilicon gate electrodes and interconnection lines.

3. The method according to claim 1 wherein said semiconductor device structures include source and drain regions and polysilicon gate electrodes and interconnection lines and first level metal lines.

4. The method according to claim 1 wherein said silicide layer is deposited by chemical vapor deposition.

5. The method according to claim 1 wherein said silicide layer is deposited by physical vapor deposition.

6. The method according to claim 1 wherein said tungsten layer is deposited using $WF_6$ gas and $SiH_4$ as precursors.

7. The method according to claim 1 wherein said tungsten layer is deposited using $WF_6$ gas and $SiH_2Cl_2$ as precursors.

8. The method according to claim 1 wherein said tungsten layer is deposited using $WF_6$ gas and $H_2$ as precursors.

9. The method according to claim 1 wherein said removing said tungsten layer not within said contact opening is performed by reactive ion etching.

10. The method according to claim 1 wherein said removing said tungsten layer not within said contact opening is performed by chemical mechanical polishing.

11. A method of forming tungsten plug metallization in the fabrication of integrated circuits comprising:

providing semiconductor device structures in and on a semiconductor substrate;

providing an insulating layer covering said semiconductor device structures wherein a contact opening is made through said insulating layer to one of said semiconductor device structures;

depositing a silicide layer conformally over the surface of said insulating layer and within said contact opening wherein said silicide layer acts as an ohmic contact and glue layer, wherein said silicide layer comprises one of the group containing $TiSi_2$, $Cosi_2$, $NiSi_x$, $PtSi_2$, and $PdSi_2$, and wherein said silicide layer is deposited to a thickness of between 200 and 500 Angstroms;

selectively removing said silicide layer not within said contact opening; and selectively depositing a tungsten layer overlying said silicide layer within said contact opening to complete said formation of said tungsten plug metallization in said fabrication of said integrated circuit.

12. The method according to claim 11 wherein said semiconductor device structures include source and drain regions and polysilicon gate electrodes and interconnection lines.

13. The method according to claim 11 wherein said semiconductor device structures include source and drain regions and polysilicon gate electrodes and interconnection lines and first level metal lines.

14. The method according to claim 11 wherein said silicide layer is deposited by chemical vapor deposition.

15. The method according to claim 11 wherein said silicide layer is deposited by physical vapor deposition.

16. The method according to claim 11 wherein said selectively removing said silicide layer is done by chemical mechanical polishing.

17. The method according to claim 11 wherein said tungsten layer is selectively deposited using $WF_6$ gas and $SiH_4$ as precursors.

18. The method according to claim 11 wherein said tungsten layer is selectively deposited using $WF_6$ gas and $SiH_2Cl_2$ as precursors.

19. The method according to claim 1 wherein said tungsten layer is selectively deposited using $WF_6$ gas and $H_2$ as precursors.

20. A method of forming tungsten plug metallization in the fabrication of integrated circuits comprising:

providing semiconductor device structures in and on a semiconductor substrate wherein said semiconductor device structures include source and drain regions and polysilicon gate electrodes and interconnection lines and first level metal lines;

providing a insulating layer covering said semiconductor device structures wherein a contact opening in made through said insulating layer to one of said semiconductor device structures;

depositing a silicide layer conformally over the surface of said insulating layer and within said contact opening wherein said silicide layer acts as an ohmic contact and glue layer and wherein said silicide layer comprises one of the group containing $TiSi_2$, $CoSi_2$, $NiSi_x$, $PtSi_2$, and $PdSi_2$ and __is deposited to a thickness of between 200 and 500 Angstroms;

depositing a tungsten layer overlying said silicide layer using $WF_6$ gas and one of the group containing $SiH_2Cl_2$, $SiH_4$, and $H_2$ as precursors; and removing said tungsten layer and said silicide layer not within said contact opening to complete said formation of said tungsten plug metallization in said fabrication of said integrated circuit.

21. The method according to claim 20 wherein said silicide layer is deposited by chemical vapor deposition or physical vapor deposition.

22. The method according to claim 20 wherein said removing said tungsten layer not within said contact opening is performed by reactive ion etching.

23. The method according to claim 20 wherein said removing said tungsten layer not within said contact opening is performed by chemical mechanical polishing.

* * * * *